United States Patent
Dong

(10) Patent No.: US 9,491,008 B2
(45) Date of Patent: Nov. 8, 2016

(54) ON-CHIP AC COUPLED RECEIVER WITH REAL-TIME LINEAR BASELINE-WANDER COMPENSATION

(71) Applicant: Rambus Inc., Sunnyvale, CA (US)

(72) Inventor: Yikui Jen Dong, Cupertino, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/789,794

(22) Filed: Jul. 1, 2015

(65) Prior Publication Data

US 2016/0013955 A1    Jan. 14, 2016

Related U.S. Application Data

(60) Provisional application No. 62/023,633, filed on Jul. 11, 2014.

(51) Int. Cl.
| | |
|---|---|
| H03K 5/007 | (2006.01) |
| H04L 25/03 | (2006.01) |
| H04L 25/06 | (2006.01) |
| H04L 25/02 | (2006.01) |

(52) U.S. Cl.
CPC ..... H04L 25/03019 (2013.01); H04L 25/0292 (2013.01); H04L 25/06 (2013.01); H03K 5/007 (2013.01)

(58) Field of Classification Search
CPC .......................... H03K 5/007; G11B 20/10203
See application file for complete search history.

(56) References Cited

U.S. PATENT DOCUMENTS

| | | | | |
|---|---|---|---|---|
| 5,844,439 | A * | 12/1998 | Zortea | H03K 5/007 327/307 |
| 6,072,366 | A * | 6/2000 | Maeda | H04B 10/6931 250/214 A |
| 6,140,857 | A | 10/2000 | Bazes | |
| 6,211,716 | B1 * | 4/2001 | Nguyen | H03F 3/45973 327/307 |
| 6,404,829 | B1 * | 6/2002 | Sonu | G11B 20/10009 375/341 |
| 7,218,687 | B2 | 5/2007 | Huang et al. | |
| 7,589,649 | B1 * | 9/2009 | Aga | H03M 1/1295 341/118 |
| 7,720,141 | B2 | 5/2010 | Fang et al. | |
| 7,756,220 | B2 | 7/2010 | Huang | |
| 7,961,817 | B2 | 6/2011 | Dong et al. | |
| 8,107,573 | B2 | 1/2012 | Chang | |
| 8,594,172 | B2 | 11/2013 | Zhong | |
| 8,599,966 | B2 | 12/2013 | Beukema et al. | |

(Continued)

OTHER PUBLICATIONS

Dong et al., "Integrated Linear AC-coupling Circuit for DC-Balanced and Non-Balanced Traffics," IEEE International Symposium on Circuits and Systems, 2007, pp. 2132-2135, May 27-30, 2007. 4 pages.

(Continued)

*Primary Examiner* — Jean B Corrielus
(74) *Attorney, Agent, or Firm* — Fenwick & West LLP

(57) ABSTRACT

An on-chip AC coupled receiver with baseline wander compensation. The receiver may be used for either single ended or differential signals. The receiver includes an input terminal to receive an input signal. AC coupling circuitry is between the input terminal and a node and couples the input signal into a coupled signal at the node. A control loop senses low frequency signal content at the node and uses a linear buffer in adjusting the coupled signal at the node based on the low frequency signal content. The operation of the control loop compensates for potential baseline wander in the coupled signal. An input stage to recovers data from the coupled signal at the node.

10 Claims, 7 Drawing Sheets

(56) References Cited

U.S. PATENT DOCUMENTS

| | | | |
|---|---|---|---|
| 9,207,696 B1* | 12/2015 | Kronmueller | G05F 1/46 |
| 2003/0206604 A1* | 11/2003 | Lai | H04L 25/063 375/350 |
| 2007/0096971 A1* | 5/2007 | Tero | H03M 1/206 341/155 |
| 2008/0063091 A1* | 3/2008 | Dong | H04L 25/0276 375/257 |
| 2008/0159415 A1* | 7/2008 | Miller | H04L 25/063 375/258 |
| 2011/0008060 A1* | 1/2011 | Kucharski | H03F 3/08 398/202 |
| 2012/0133414 A1 | 5/2012 | Zhuang | |
| 2012/0155528 A1* | 6/2012 | Zhong | A61B 5/7225 375/232 |
| 2013/0002347 A1* | 1/2013 | Beukema | H03G 3/3089 330/127 |

OTHER PUBLICATIONS

Fang et al., "A 5.2Gbps HyperTransport Integrated AC Coupled Receiver with DFR DC Restore," 2007 Symposium on VLSI Circuits Digest of Technical Papers, pp. 34-35. 2 pages.

Gangasani et al., "A 32-Gb/s Backplane Transceiver with On-chip AC-coupling and Low Latency CDR in 32-nm SOI CMOS Technology," 2013 IEEE Asian Solid-State Circuits Conference, pp. 213-216, Nov. 11-13, 2013. 4 pages.

Quan et al., "A 1.0625-to-14.025Gb/s Multimedia Transceiver With Full-Rate Source-Series-Terminated Transmit Driver and Floating-Tap Decision-Feedback Equalizer in 40nm CMOS," 2011 IEEE International Solid-State Circuits Conference, ISSCC 2011, pp. 348-350, Feb. 20-24, 2011. 3 pages.

Zhong et al., "A 1.0625~14.025 Gb/s Multi-Media Transceiver With Full-Rate Source-Series-Terminated Transmit Driver and Floating-Tap Decision-Feedback Equalizer in 40 nm CMOS," IEEE Journal of Solid-State Circuits, vol. 46, No. 12, pp. 3126-3139, Dec. 2011. 14 pages.

Zhuang et al., "Linear Equalization and PVT-Independent DC Wander Compensation for AC-Coupled PCIe 3.0 Receiver Front End," IEEE Transactions on Circuits and Systems—II: Express Briefs, vol. 58, No. 5, pp. 289-293, May 2011. 5 pages.

\* cited by examiner

ON-CHIP AC COUPLED RECEIVER WITH REAL-TIME LINEAR BASELINE-WANDER COMPENSATION

CROSS REFERENCE TO RELATED APPLICATION

This application claims priority from U.S. Provisional Patent Application No. 62/023,633 filed on Jul. 11, 2014, the contents of which are incorporated by reference in its entirety.

BACKGROUND

In high speed data transmission systems, an AC coupling capacitor is typically placed in the channel between the transmitter and receiver. When data transmitted across the channel has long run length, and is not DC balanced for an extended period of time, the AC coupling capacitor has the negative side effect of causing the coupled input signal at the receiver to experience baseline wander. The baseline wander reduces both the eye width and the eye height at the receiver.

BRIEF DESCRIPTION OF THE DRAWINGS

The teachings of the embodiments herein can be readily understood by considering the following detailed description in conjunction with the accompanying drawings.

DETAILED DESCRIPTION OF EMBODIMENTS

Reference will now be made in detail to several embodiments of the present disclosure, examples of which are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

Embodiments of the present disclosure relate to an on-chip AC coupled receiver with baseline wander compensation. The AC coupled receiver may be used for processing single ended or differential signals. The receiver includes an input terminal to receive an input signal. AC coupling circuitry is between the input terminal and a node and couples the input signal into a coupled signal at the node. A control loop senses low frequency signal content at the node and uses a linear buffer in adjusting the coupled signal at the node based on the low frequency signal content. The operation of the control loop compensates for potential baseline wander in the coupled signal. A data recovery stage recovers data from the coupled signal at the node.

In one embodiment, a non-transitory computer readable medium storing a representation of the receiver is disclosed. In another embodiment, a method of operation in the receiver is disclosed.

Figure 1:
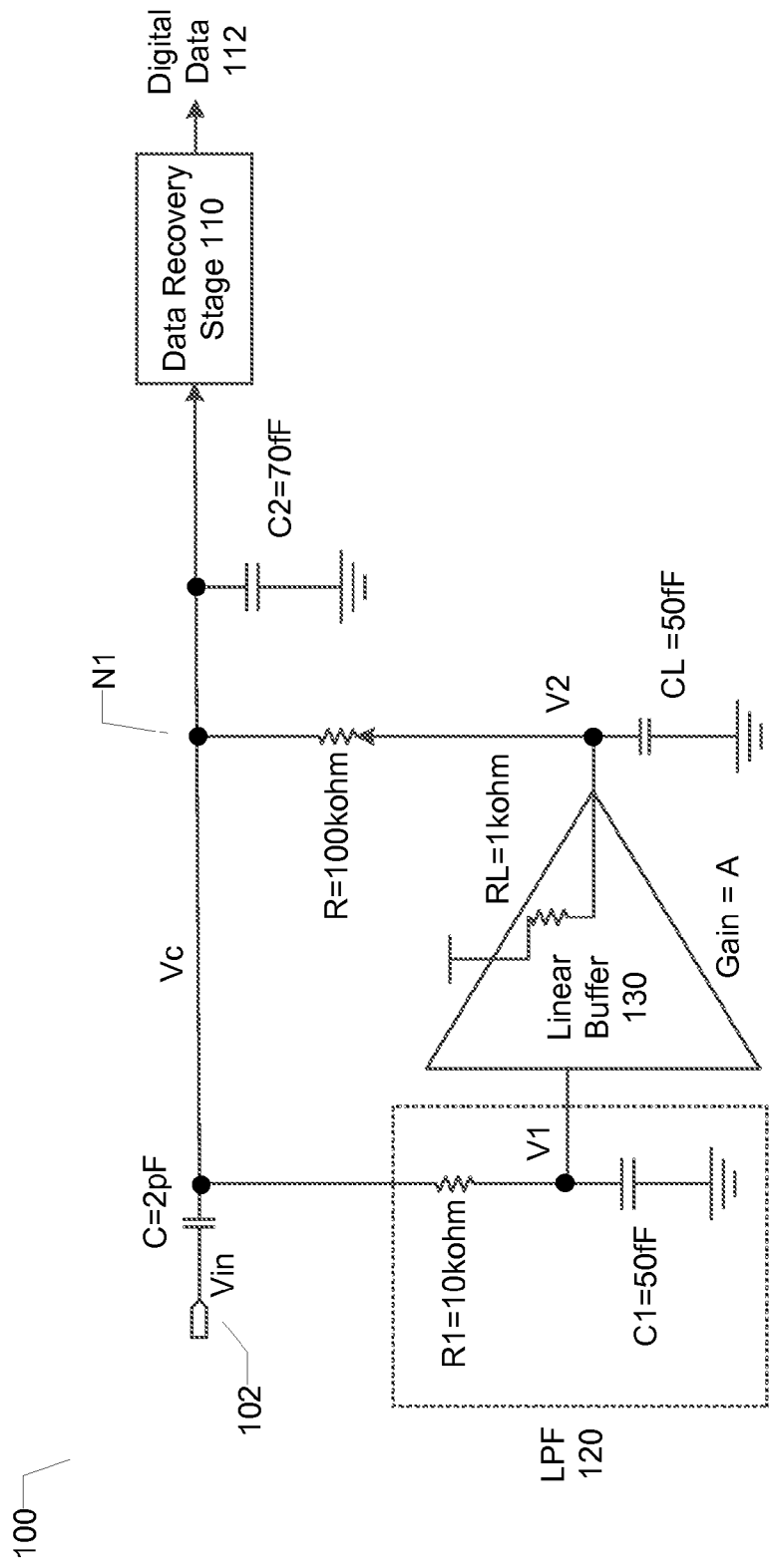
FIG. 1 is a single ended on-chip AC coupled receiver with real-time linear baseline wander compensation, according to an embodiment of the present disclosure.

FIG. 1 is a single ended on-chip AC coupled receiver 100 with real-time linear baseline wander compensation, according to an embodiment of the present disclosure. The receiver 100 may be found on-chip in an integrated circuit (IC). The receiver 100 is responsible for receiving an input signal Vin from a remote transmitter via a serial communication channel, and then converting the input signal Vin into digital data 112. The receiver 100 includes an input terminal 102, an AC coupling capacitor C, a data recovery stage 110, a low pass filter 120, a linear buffer 130 and resistor R.

The input terminal 102 receives an input signal Vin from a remote transmitter (not shown) through a communication channel. AC coupling capacitor C performs AC coupling on the input signal Vin to remove DC components of the input signal Vin. AC coupling capacitor C is one example of AC coupling circuitry. The AC components of the input signal Vin are passed through the coupling capacitor C and form the coupled signal Vc at node N1.

The input of the data recovery stage 110 is connected to node N1. Data recovery stage 110 receives the coupled signal Vc at node N1 and recovers digital data 112 from the coupled signal Vc. The data recovery stage 110 includes circuitry that uses various signal processing techniques to make a decision about whether an analog voltage level of the coupled signal Vc represents a logical value of 0 or 1 (or other logical value). The data recovery stage 110 then outputs digital data that is indicates the logical value of the coupled signal Vc. Examples of circuitry that may be found in the data recovery stage 110 include variable gain amplifiers (VGA), continuous time equalizers (CTLE), decision feedback equalizers (DFE), clock and data recovery circuit (CDR) and de-serializers, among others. C2 is the input capacitance of the data recovery stage 110.

Low pass filter 120, linear buffer 130, and resistor R form an analog control loop that starts and ends at node N1. When the input data stream of the input signal Vin has a long run length, and is not DC balanced for an extended period of time, low frequency content in the input data stream can cause baseline wander in the coupled signal Vc at node N1. For example, the low frequency content of the input data stream can be a sequential data stream of "11111111" or "00000000." This low frequency content typically results in a coupled signal Vc that includes this low frequency content but also decays over time due to baseline wander.

The control loop compensates for the baseline wander by using the coupled signal Vc at node N1 to sense low frequency signal content. The control loop then adjusts the coupled signal Vc when there is low frequency signal content to compensate for potential baseline wander. The operation of the control loop is also linear. Linear operation prevents non-linear distortion from being introduced into the coupled signal Vc, which can cause problems for circuits in the input recovery stage 110, such as a DFE. The circuits of the control loop are now explained in greater detail.

The low pass filter 120 receives coupled signal Vc and performs a low pass filtering on the coupled signal Vc. The low pass filter 120 generates a wander sensing signal V1 that is a low passed version of coupled signal Vc. The low pass filter 120 includes a resistor R1 in series between node N1 and an input of the linear buffer 130, and a capacitor C1 coupled between the input of the linear buffer 130 and ground. The cut-off frequency of the low pass filter 120 is defined by the values of R1 and C1. The low pass filter 120 causes the amplitude of the wander sensing signal V1 to indicate the presence of low frequency content that is below the cut-off frequency. In one embodiment, capacitor C1 represents the routing and input capacitance of the linear buffer 130.

Conceptually, low pass filter 120 can also be viewed as a delay circuit that introduces an RC delay between coupled input signal Vc and sensing signal V1. When there is low frequency content in the input data stream, the voltage level of coupled signal Vc at a present time affects the voltage level of wander sensing signal V1 at a future time.

Linear buffer 130 receives wander sensing signal V1 at its input and generates a compensation signal V2 at its output. The linear buffer 130 is also an amplifier with gain of A, where A is less than one and greater than zero. This reduces the amplitude of the compensation signal V2 when compared to the sensing signal V1 to increase stability of the control loop. The gain A is linearly applied such that compensation signal V2 is linearly proportional to the wander sensing signal V1. The linear amplification prevents distortion from being introduced into the compensation signal V2. Linear buffer 130 also has an output impedance RL and an output capacitance CL.

Resistor R is connected in series between the output of the linear buffer 130 and node N1. Compensation signal V2 is combined or added to coupled signal Vc through the resistor R, thereby adjusting coupled signal Vc. When compensation signal V2 is used to adjust coupled signal Vc, it compensates for possible decay in the coupled signal Vc and reduces baseline wander. The size of resistor R also introduces an additional delay between coupled signal V2 and the adjustment of coupled signal Vc.

Figure 2:
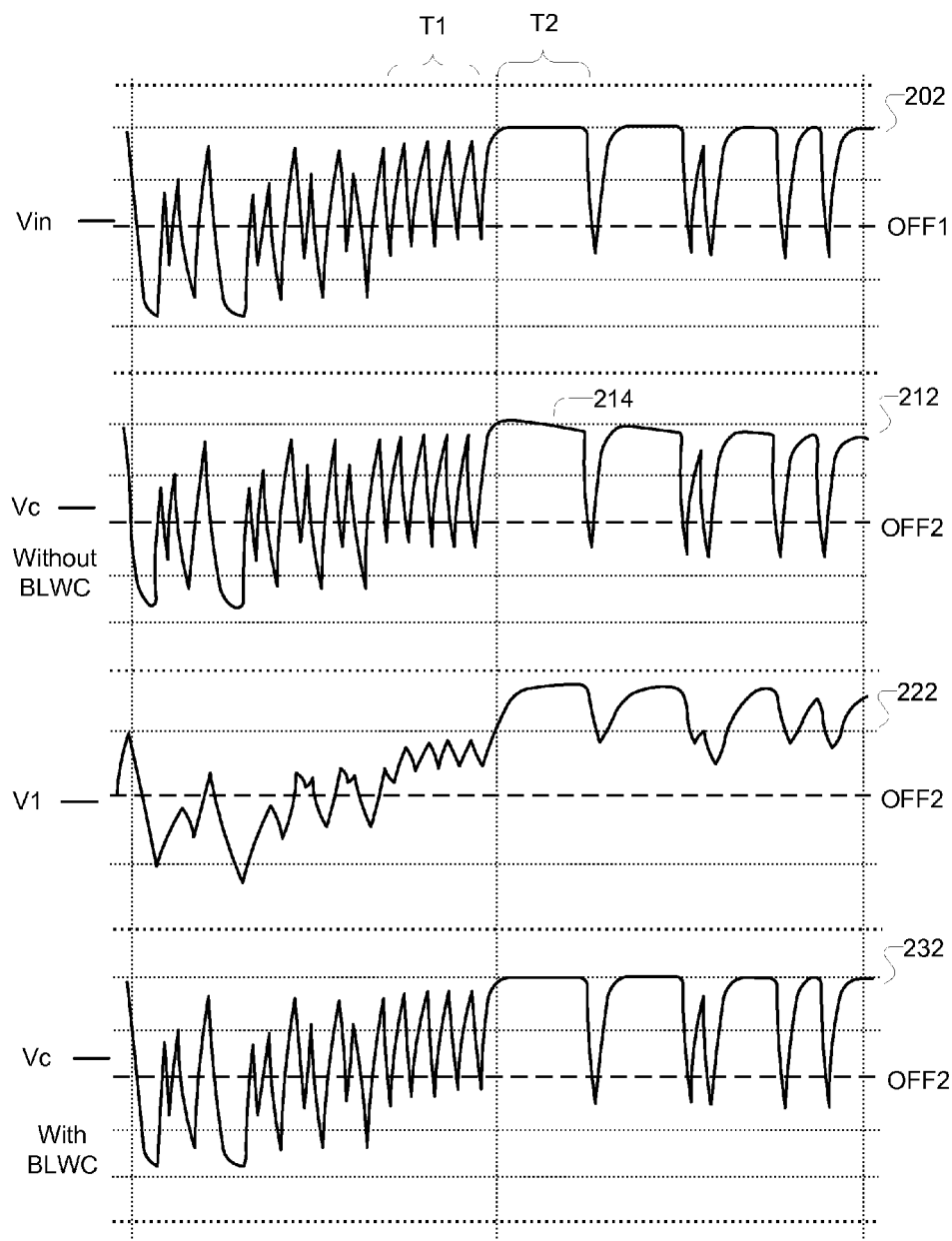
FIG. 2 illustrates waveforms within the receiver of FIG. 1, according to an embodiment of the present disclosure.

FIG. 2 illustrates signal waveforms within the receiver 100 of FIG. 1, according to an embodiment of the present disclosure. It should be noted that the waveforms may not be to scale along the y axis and the scale may be exaggerated to illustrate the concepts of the present disclosure.

The first waveform 202 shows the input signal Vin. The input signal Vin is not DC balanced and includes some time periods T1 where the input signal Vin is constantly switching to transfer high frequency data (e.g., 101010), and other time periods T2 where the input signal Vin is held relatively constant due to low frequency data (e.g., 1111111).

The second waveform 212 shows the coupled signal Vc without baseline wander compensation (BLWC). The second waveform 212 represents the problem to be solved by the present disclosure. During time period T2, the voltage at coupled signal Vc initially rises due to the switching of the input signal Vin. However, coupled signal Vc then starts to droop 214 due to the lack of transitions in the input signal Vin. This phenomenon is known as baseline wander and causes the size of the input data eye to decrease, thereby making it more difficult to recover the correct digital data 112 from the coupled signal Vc.

The third waveform 222 shows the wander sensing signal V1. The amplitude level of the wander sensing signal V1 varies depending on whether there is low frequency content at the coupled signal Vc. The amplitude level of the wander sensing signal V1 thus indicates whether there is low frequency input content that has the potential to cause baseline wander. For example, during time T2, the amplitude of V1 is high to indicate the presence of low frequency content, whereas during time T2 the amplitude of V1 is low due to the high frequency content.

A waveform for compensation signal V2 is not shown in FIG. 2, but it would appear as a reduced amplitude version of sensing signal V1.

The fourth waveform 232 shows the coupled signal Vc with baseline wander compensation, according to an embodiment of the present disclosure. Because the compensation signal V2 is now used to adjust coupled signal Vc, the baseline wander is compensated for such that the coupled signal Vc no longer decays during time period T2.

Also, the input signal Vin before the coupling capacitor C has a DC offset level OFF1 that is different than the DC offset level OFF2 of the coupled signal Vc after the coupling capacitor C (sensing signal V1 may also have the same offset level OFF2). In some embodiments, the linear buffer 130 can adjust this DC offset level OFF2 by introducing a constant voltage offset onto compensation signal V2. The DC offset level OFF2 is adjusted so that coupled signal Vc has a desired offset for the data recovery stage 110. Baseline wander effects created by the coupling capacitor C are compensated for through the operation of the control loop.

Figure 3A:
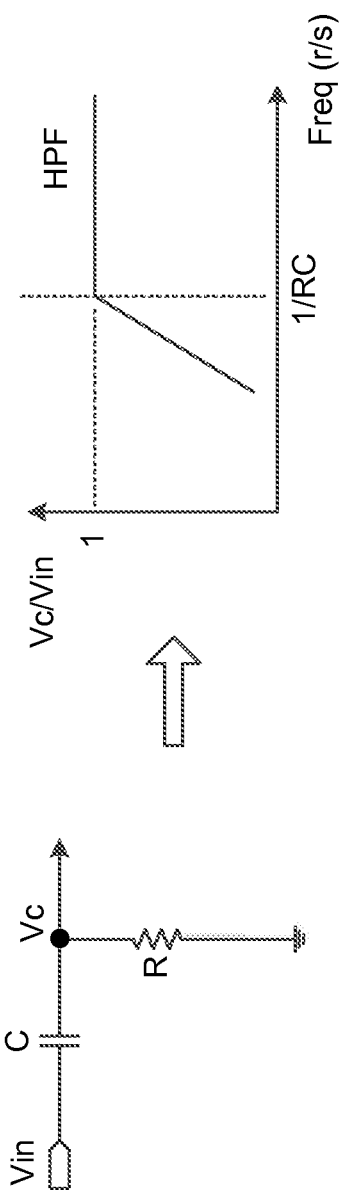
FIG. 3A is a frequency response of a coupled signal without baseline wander compensation, according to an embodiment of the present disclosure.

FIG. 3A-3D illustrate operation of the receiver 100 in the frequency domain. FIG. 3A illustrates a frequency response of the coupled signal Vc without baseline wander compensation, according to an embodiment of the present disclosure. Capacitor C and resistor R create a high pass filter with a first order cut-off frequency of 1/RC. Frequency components above 1/RC are passed onto the output signal Vc, and frequency components below 1/RC are cut off.

Figure 3B:
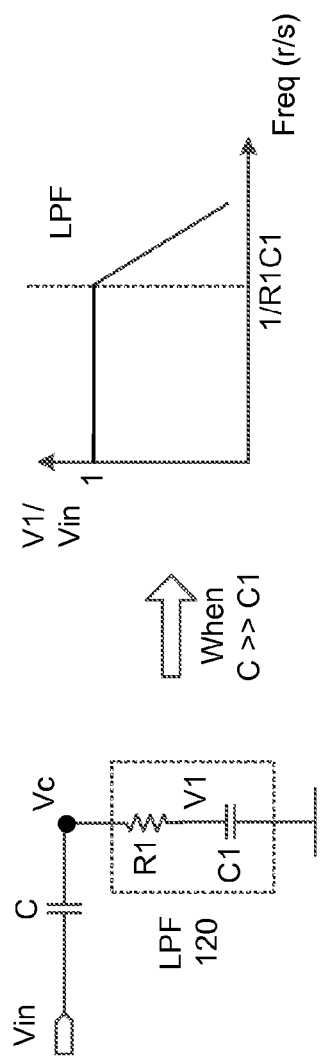
FIG. 3B is a frequency response of a sensing signal, according to an embodiment of the present disclosure.

FIG. 3B illustrates a frequency response of the wander sensing signal V1, according to an embodiment of the present disclosure. The frequency response of wander sensing signal V1 has a cut-off frequency of 1/(R1*C1) due to low pass filter. This assumes that the value of C is substantially greater than the value of C1. Thus, frequency components of the input signal Vin that are below 1/(R1*C1) are passed onto the wander sensing signal V1 via coupled signal Vc, whereas frequency components above 1/(R1*C1) are cut off.

Figure 3C:
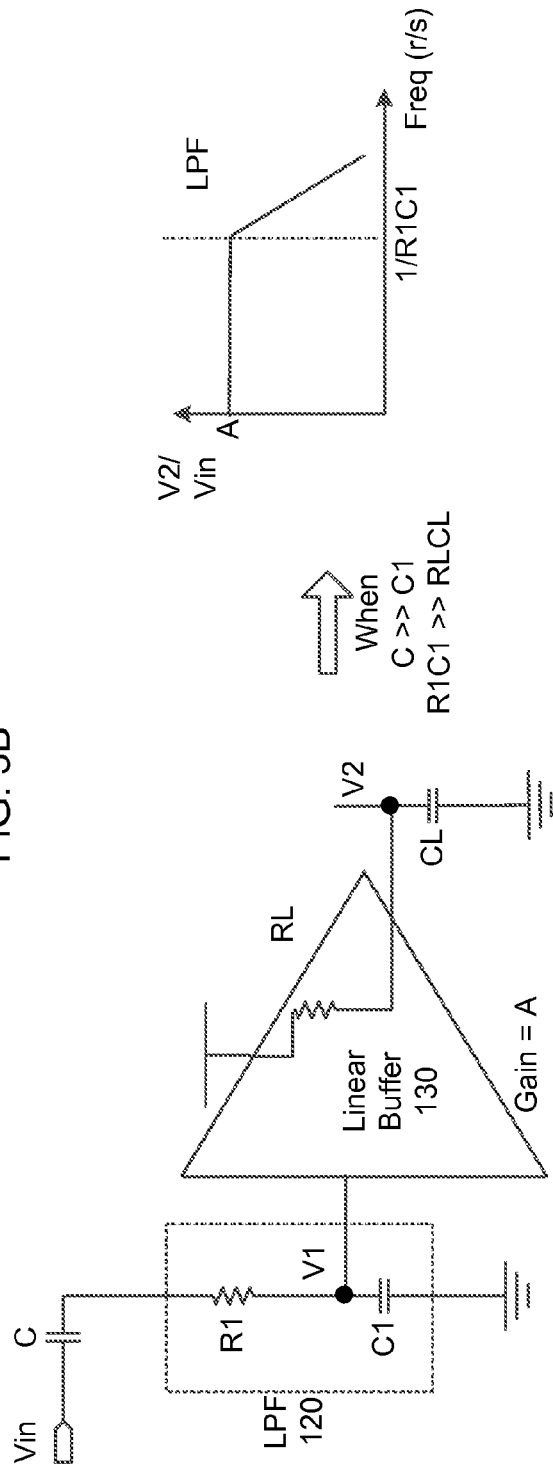
FIG. 3C is a frequency response of a compensation signal, according to an embodiment of the present disclosure.

FIG. 3C illustrates a frequency response of the compensation signal V2, according to an embodiment of the present disclosure. The frequency response of compensation signal V2 has a cut-off frequency of 1/(R1*C1), which is the same as the cut-off frequency of wander sensing signal V1. Compensation signal V2 is also scaled by a gain A due to the gain of the linear buffer 130. The frequency response in FIG. 3C assumes that R1*C1 is substantially greater than RL*CL, which causes the effect of RL and CL on the frequency response to be negligible.

Figure 3D:
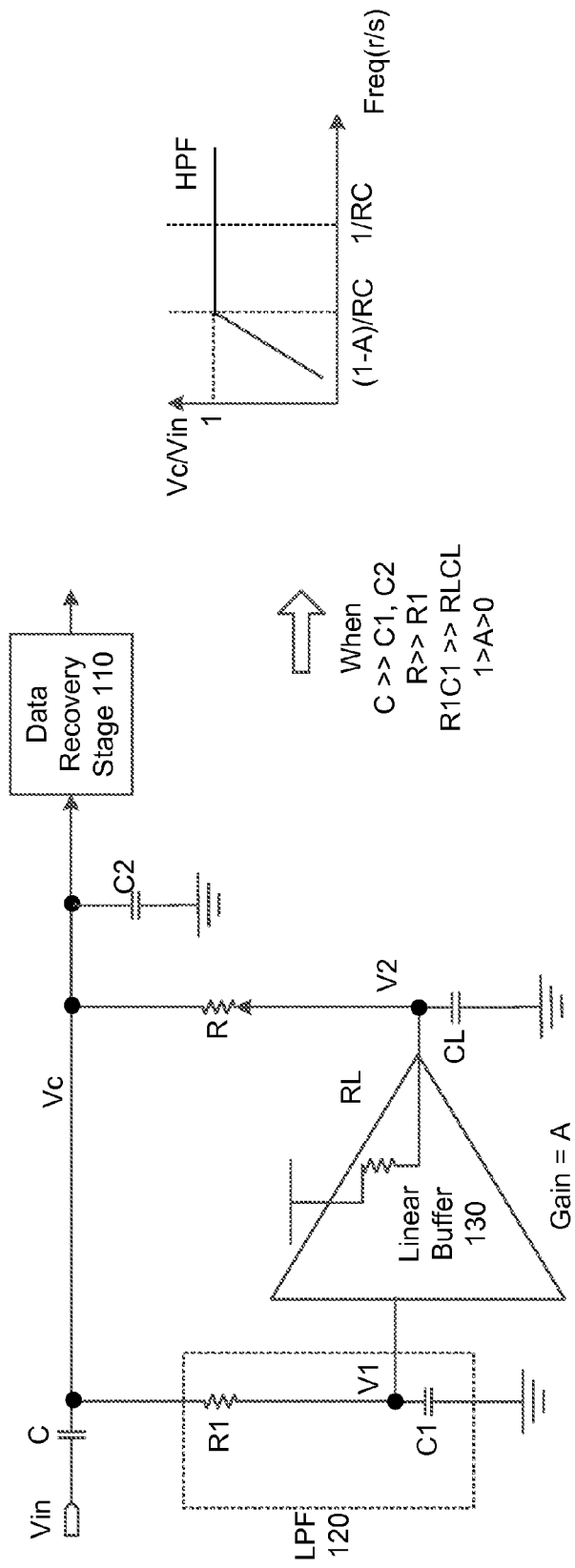
FIG. 3D is a frequency response of a coupled signal with linear baseline wander compensation, according to an embodiment of the present disclosure.

FIG. 3D illustrates a frequency response of the coupled signal Vc with baseline wander compensation, according to an embodiment of the present disclosure. The cut off frequency of the coupled signal Vc is now (1−A)/(R*C) due to the effects of the control loop. This frequency response further assumes that the capacitance of C is substantially greater than C2, where C2 is the input capacitance of the data recovery stage 110. This frequency response also assumes that that resistance of R is substantially greater than the resistance of R1. This frequency response also assumes that the gain A of the buffer 130 is less than 1 and greater than 0.

When compared to frequency response of FIG. 3A, the cut off frequency of the coupled signal Vc has been lowered from 1/RC to (1−A)/(R*C). The lowered cut-off frequency means that baseline wander due to low frequency signal content in the frequency range between (1−A)/(R*C) to 1/RC is now compensated for.

The characteristics of the receiver 100 can be mathematically explained with the following equations. The frequency response of the coupled signal Vc relative to the input signal Vin is first defined in equation 1.

$$H(s) = \frac{Vc(s)}{Vin(s)} = \frac{sRC}{1 + sR(C + C_2) + \frac{sRC_1 - A}{1 + sR_1C_1}} \quad \text{(equation 1)}$$

In equation 1, s is frequency. H(s) is the gain of the coupled signal Vc relative to the input signal Vin at different frequencies s. Note that, in the generation of equation 1, it is assumed that $R_L$ and $C_L$ have values that do not substantially affect the operation of the receiver 100.

Since C>>C2, equation 1 can be simplified into equation 2.

$$H(s) = \frac{Vc(s)}{Vin(s)} = \frac{sRC}{1 + sRC + \frac{sRC_1 - A}{1 + sR_1C_1}} \quad \text{(equation 2)}$$

Equation 2 can be re-arranged into equation 3.

$$H(s) = \frac{Vc(s)}{Vin(s)} = \frac{sRC(1 + sR_1C_1)}{(1 + sRC)(1 + sR_1C_1) + sRC_1 - A} \quad \text{(equation 3)}$$

Since sRC>>sR1C1, the equation can be further simplified into equation 4

$$H(s) = \frac{Vc(s)}{Vin(s)} = \frac{sRC\frac{(1 + sR_1C_1)}{1 - A}}{1 + sRC\frac{(1 + sR_1C_1) + C_1/C}{1 - A}} \quad \text{(equation 4)}$$

Since C>>C1, the equation can be further simplified into equation 5

$$H(s) = \frac{Vc(s)}{Vin(s)} = \frac{sRC\frac{(1 + sR_1C_1)}{1 - A}}{1 + sRC\frac{(1 + sR_1C_1)}{1 - A}} \quad \text{(equation 5)}$$

Thus, in equation 5, gain at high frequencies is substantially equal to 1. Gain at low frequencies is substantially equal to 0. The first order cut-off frequency of the frequency response is (1−A)/RC.

To achieve this result, the component values in the receiver 100 of FIG. 1 are selected as follows: (1) C is substantially greater than C1 and C2 and (2) R is substantially greater than R1 and (3) R1*C1 is substantially greater than RL*CL. In one embodiment a value is substantially greater than another value if it is greater by a factor of 10 or more.

Figure 4:
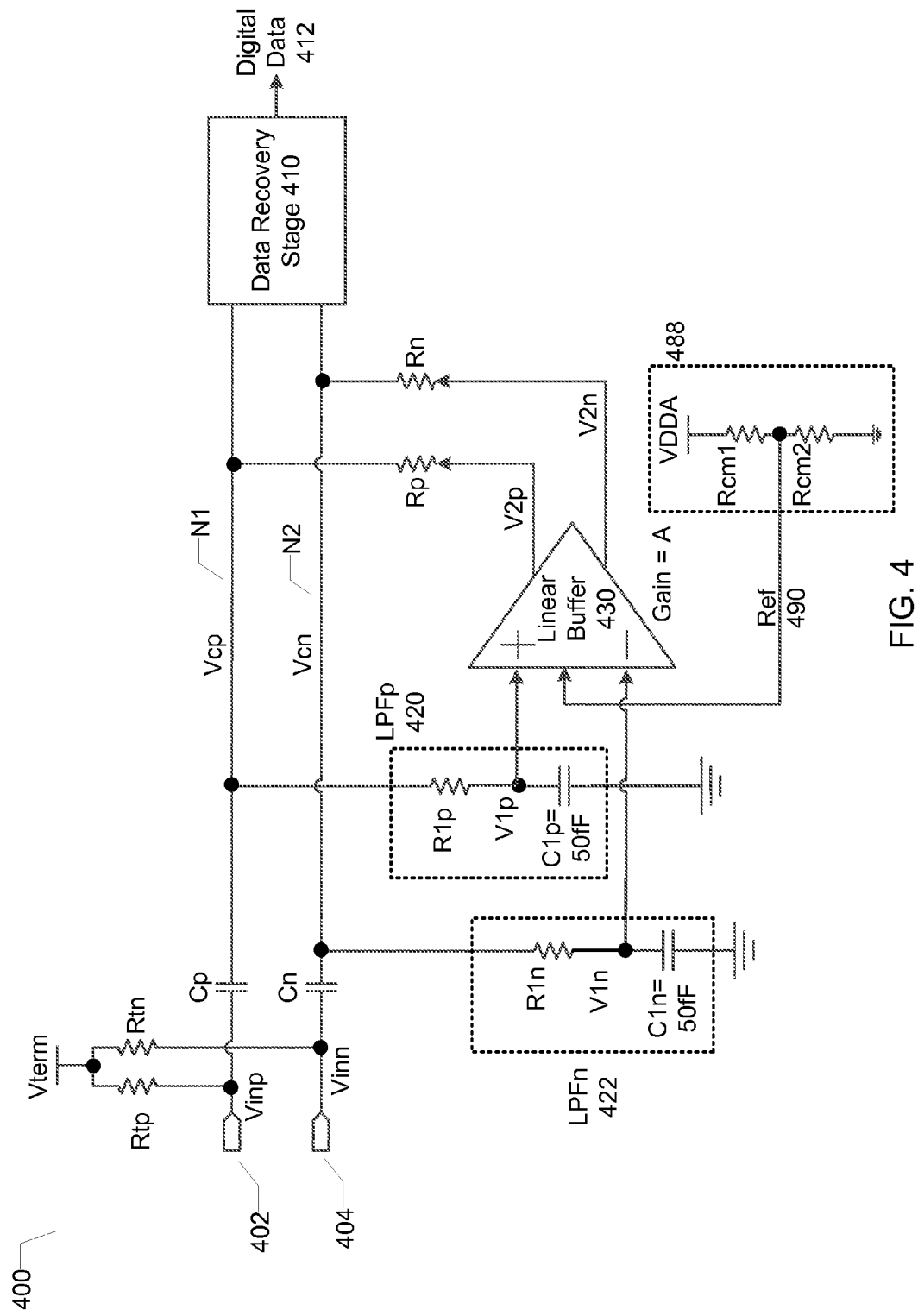
FIG. 4 is a differential on-chip AC coupled receiver with real-time linear baseline wander compensation, according to an embodiment of the present disclosure.

FIG. 4 is a differential on-chip AC coupled receiver 400 with real-time linear baseline wander compensation, according to an embodiment of the present disclosure. The differential receiver 400 of FIG. 4 is similar to the single ended receiver 100 of FIG. 1, but now processes a differential input signal instead of a single ended input signal. As a result, the differential receiver 400 duplicates most of the circuitry of the single ended receiver 100 for processing of both a positive input signal Vinp and a negative input signal Vinn. The description of components in the single-ended receiver 100 of FIG. 1 also applies to their corresponding components in the differential receiver 400 of FIG. 4 and may be omitted herein for ease of explanation.

As shown in FIG. 4, the receiver 400 includes two input ports 402 and 404, two termination resistors Rtp and Rtn, two coupling capacitors Cp and Cn, a data recovery stage 410, two low pass filters 420 and 422, a differential linear buffer 430, resistors Rp and Rn, and a common mode reference generator 488.

Positive input port 402 and negative input port 404 receive a differential signal through a differential communication channel. Positive input port 402 receives a positive input signal Vinp. Negative input port 404 receives a negative input signal Vinn. Positive input signal Vinp and negative input signal Vinn form a differential signal pair. Positive input port 402 and negative input port 404 are terminated to a termination voltage Vterm through respective termination resistors Rtp and Rtn.

AC coupling capacitor Cp performs AC coupling on the positive input signal Vinp to remove DC components of the positive input signal Vinp. The cutoff frequency of the signal components passed on to the positive coupled signal Vcp at node N1 is defined by a high pass filter formed by capacitor Cp and resistor Rp. AC coupling capacitor Cn performs AC coupling on the negative input signal Vinn to remove DC components of the negative input signal Vinn. The cutoff frequency of the negative signal components passed on to the negative coupled signal Vcn at node N2 is defined by a high pass filter formed by capacitor Cn and resistor Rn.

Data recovery stage 410 receives the coupled signals Vcp and Vcn and recovers digital data 412 from the difference between coupled signals Vcp and Vcn. The data recovery stage 110 then outputs digital data that indicates the logical value of the difference between coupled signals Vcp and Vcn.

Low pass filter 420, linear buffer 430, and resistor Rp form a first part of a control loop that starts and ends at node N1. The control loop compensates for baseline wander by sensing low frequency signal content in the positive coupled signal Vcp at node N1 and adjusting the positive coupled signal Vcp in accordance with the low frequency signal content.

Low pass filter 420 generates a wander sensing signal V1p indicative of low frequency content in the positive input signal Vinp. Low pass filter 420 includes a resistor R1p and a capacitor C1p that define a cutoff frequency of the low pass filter 420. Linear buffer 430 is a differential buffer that generates positive compensation signal V2p from positive wander sensing signal V1p with a gain of A. Resistor Rp is connected in series between the positive output of the linear buffer 430 and node N1. Positive compensation signal V2p is combined with positive coupled signal Vcp through the resistor Rp.

Low pass filter 422, linear buffer 430, and resistor Rn form a second part of the control loop that starts and ends at node N2. The control loop compensates for baseline wander by sensing low frequency signal content in the negative coupled signal Vcn at node N2 and adjusting the negative coupled signal Vcn in accordance with the low frequency signal content.

Low pass filter 422 generates a wander sensing signal V1n indicative of low frequency content in the negative input signal Vinn. Low pass filter 422 includes a resistor R1n and a capacitor C1n that define a cutoff frequency of the low pass filter 422. Linear buffer 430 generates negative compensation signal V2n from negative wander sensing signal V1n with a gain of A. Resistor Rn is connected in series between the negative output of the linear buffer 430 and node N2. Negative compensation signal V2n is combined with negative coupled signal Vcn through the resistor Rn.

Linear buffer 430 can also be used to adjust a common mode voltage of the coupled signals Vcp and Vcn. A common mode voltage is a DC voltage offset that is common to both signals of a differential pair. Common mode reference generator 488 generates a common mode reference voltage 490 that is provided to linear buffer 430. In one embodiment, common mode reference generator 488 includes two resistors Rcm1 and Rcm2 connected to a supply voltage VDDA and that form a voltage divider. Linear buffer 430 receives the reference voltage 490 and adjusts the common mode voltage of compensation signals V2p and V2n in accordance with the common mode reference voltage 490. When compensation signals V2p and V2n are combined with coupled signal Vcp and Vcn, it causes an adjustment in the common mode voltage of coupled signals Vcp and Vcn. In this manner, the common mode voltage of the coupled signals Vcp and Vcn can be made different than the common mode voltage of input signals Vinn and Vinp while also compensating for baseline wander.

Figure 5:
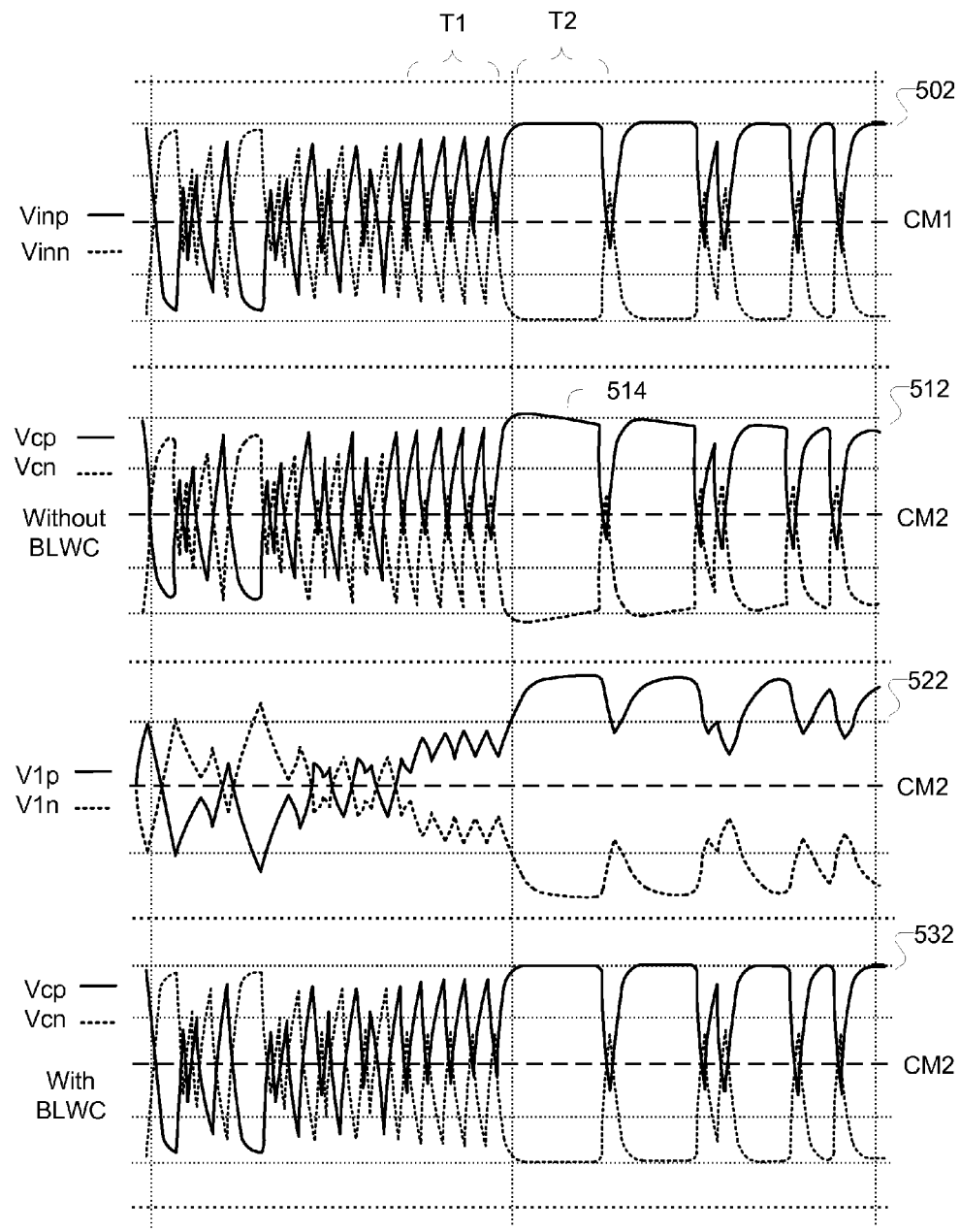
FIG. 5 illustrates waveforms within the receiver of FIG. 1, according to an embodiment of the present disclosure.

FIG. 5 illustrates signal waveforms within the receiver 400 of FIG. 4, according to an embodiment of the present disclosure. The waveforms for the positive input signal Vinp, positive coupled signal Vcp, and positive sensing signal V1p are substantially the same as the waveforms shown in FIG. 2. The waveforms for the negative input signal Vinn, negative coupled signal Vcn, and negative sensing signal V1n are inverted relative to their positive counterparts.

The first waveforms 502 show input signals Vinp and Vinn. High frequency input content is being transferred during time T1, and low frequency input content is being transferred during time T2.

The second waveforms 512 show coupled signals Vcp and Vcn without baseline wander compensation. The second waveforms 512 represent the problem to be solved by the present disclosure. The coupled signals Vcp and Vcn both decay 514 during time T2 due to the presence of low frequency input content.

The third waveforms 522 show wander sensing signals V1p and V1n. Wander sensing signals V1p and V1n have increased amplitude during time T2 to indicate the presence of low frequency content that can cause baseline wander.

The fourth waveforms 532 show coupled signals Vcp and Vcn with baseline wander compensation. Because the compensation signals V2p and V2n are now being combined with coupled signals Vcp and Vcn, the baseline wander in both coupled signals Vcp and Vcn is now compensated for.

Also, the input signals Vinp and Vinn before the coupling capacitors Cp and Cn have a common mode voltage CM1 that is different than the common mode voltage CM2 of the coupled signals Vcp and Vcn after the coupling capacitors Cp and Cn (sensing signals V1p and V1n may also have the same common mode voltage CM2). As previously described, the linear buffer 430 can adjust this common mode voltage CM2 by introducing a common mode voltage level onto compensation signals V2p and V2n. The common mode voltage CM2 is adjusted so that coupled signals Vcp and Vcn have a desired common mode level for the data recovery stage 110. Baseline wander effects created by the coupling capacitors Cp and Cn are compensated for through the operation of the control loop.

In one embodiment, a representation of circuits within the receiver 100 or 400 may be stored as data in a non-transitory computer-readable medium (e.g. hard disk drive, flash drive, optical drive). These representations may in the form of, for example, behavioral level descriptions, register transfer level descriptions, logic component level descriptions, transistor level descriptions or layout geometry-level descriptions.

Upon reading this disclosure, those of skill in the art may appreciate still additional alternative designs for an on-chip AC coupled receiver with real-time linear baseline-wander compensation. Thus, while particular embodiments and applications of the present disclosure have been illustrated and described, it is to be understood that the disclosure is not limited to the precise construction and components disclosed herein. Various modifications, changes and variations which may be apparent to those skilled in the art may be made in the arrangement, operation and details of the method and apparatus of the present disclosure herein without departing from the spirit and scope of the disclosure as defined in the appended claims.

What is claimed is:

1. An on-chip alternating current (AC) coupled receiver with baseline wander compensation, the receiver comprising:
   a first input terminal to receive a first input signal;
   first AC coupling circuitry between the first input terminal and a first node, the first AC coupling circuitry coupling the first input signal into a first coupled signal at the first node;
   a data recovery circuit to recover data from the first coupled signal at the first node; and
   a control loop circuit comprising a low pass filter to generate a signal indicative of low frequency signal content at the first node based on the first coupled signal at the first node, the control loop using a linear buffer in adjusting the first coupled signal at the first node based on the signal indicative of the low frequency signal content.

2. The receiver of claim 1, wherein the low pass filter comprises:
   a first resistor coupled between the first node and an input of the first buffer; and
   an input capacitance of the linear buffer.

3. The receiver of claim 2, wherein the control loop circuit comprises a second resistor coupled in series between an output of the linear buffer and the first node, the second resistor having a substantially greater resistance than the first resistor.

4. The receiver of claim 1, wherein the linear buffer generates a compensation signal based on the signal indicative of the low frequency input signal content, and wherein the control loop adjusts the first coupled signal based on the compensation signal.

5. The receiver of claim 1, wherein a gain of the linear buffer is less than one.

6. The receiver of claim 1, wherein the control loop circuit also adjusts a direct current (DC) voltage offset of the first coupled signal.

7. The receiver of claim 1, wherein the low pass filter receives the first coupled signal and low pass filters the first coupled signal into the signal indicative of low frequency signal content.

8. An on-chip alternating current (AC) coupled receiver with baseline wander compensation, the receiver comprising:
 a first input terminal to receive a first input signal;
 first AC coupling circuitry between the first input terminal and a first node, the first AC coupling circuitry coupling the first input signal into a first coupled signal at the first node;
 a second input terminal to receive a second input signal;
 second AC coupling circuitry between the second input terminal and a second node, the second AC coupling circuitry coupling the second input signal into a second coupled signal at the second node,
 a data recovery circuit to recover data based on the first coupled signal at the first node and the second coupled signal at the second node; and
 a control loop circuit to sense low frequency signal content at the first node and to use a linear buffer in adjusting the first coupled signal at the first node based on the low frequency signal content at the first node, the control loop circuit further sensing low frequency signal content at the second node and using the linear buffer in adjusting the second coupled signal at the second node based on the low frequency signal content at the second node.

9. The receiver of claim 8, wherein the control loop circuit also adjusts a common mode voltage of the first coupled signal and the second coupled signal.

10. A method of operation in an on-chip alternating current (AC) coupled receiver with baseline wander compensation, the method comprising:
 receiving a first input signal at a first input terminal;
 coupling the first input signal into a first coupled signal at a first node using first AC coupling circuitry;
 sensing low frequency signal content at the first node;
 receiving a second input signal at a second input terminal;
 coupling the second input signal into a second coupled signal at a second node using second AC coupling circuitry;
 sensing low frequency signal content at the second node;
 adjusting, with a linear buffer, the first coupled signal at the first node based on the low frequency signal content at the first node, and adjusting, with the linear buffer, the second coupled signal at the second node based on the low frequency signal content at the second node; and
 recovering data from the first coupled signal at the first node and the second coupled signal at the second node.

* * * * *